United States Patent [19]

Scheitlin et al.

[11] Patent Number: 4,969,032

[45] Date of Patent: Nov. 6, 1990

[54] MONOLITHIC MICROWAVE INTEGRATED CIRCUIT HAVING VERTICALLY STACKED COMPONENTS

[75] Inventors: Douglas G. Scheitlin, Chandler; Charles E. Weitzel, Tempe, both of Ariz.

[73] Assignee: Motorola Inc., Schaumburg, Ill.

[21] Appl. No.: 220,279

[22] Filed: Jul. 18, 1988

[51] Int. Cl.⁵ .............................................. H01L 29/80
[52] U.S. Cl. ....................................... 357/22; 333/279; 357/51; 357/61; 357/89; 505/856
[58] Field of Search ........................ 357/51, 22, 61, 63, 357/64, 89, 90; 333/279; 505/701, 856

[56] References Cited

U.S. PATENT DOCUMENTS 4,737,733 4/1988 LaPrade ............................... 330/277
4,745,448 5/1988 VanRees et al. ....................... 357/22

Primary Examiner—Thomas H. Yarcza
Assistant Examiner—David Cain
Attorney, Agent, or Firm—Harry A. Wolin

[57] ABSTRACT

A monolithic microwave integrated circuit having multiple, vetically stacked components wherein at least three metal layers isolated from each other by layers of non-conducting material are formed on a semi-insulating substrate, generally comprised of gallium arsenide. Vertically stacked capacitors, inductors and various combinations thereof may be fabricated using the present invention. Further, the vetrically stacked components may be formed on active devices such as FETs and diodies.

26 Claims, 2 Drawing Sheets

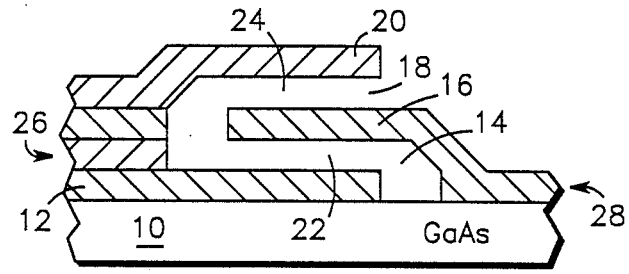
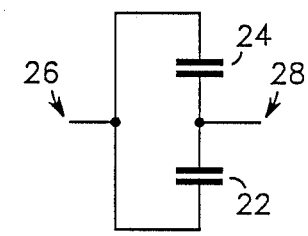
FIG. 1A  FIG. 1B
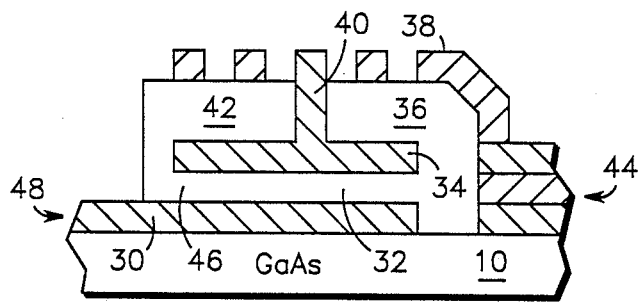
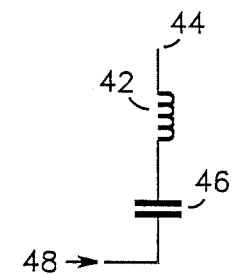
FIG. 2A  FIG. 2B
FIG. 3A  FIG. 3B
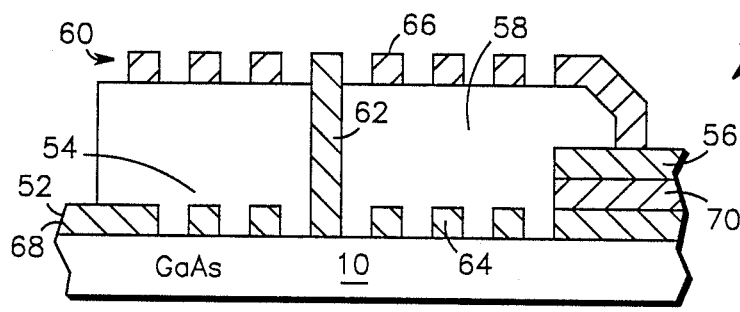
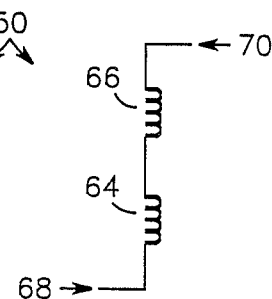

MONOLITHIC MICROWAVE INTEGRATED CIRCUIT HAVING VERTICALLY STACKED COMPONENTS

BACKGROUND OF THE DISCLOSURE

This invention relates, in general, to semiconductor devices, and more particularly to monolithic microwave integrated circuits having multiple, vertically stacked components.

It is well known in the semiconductor art that gallium arsenide has many unique properties and characteristics which are desirable in various semiconductor devices. For instance, semiconductor devices capable of operating at relatively high frequencies may be fabricated using gallium arsenide. Additionally, gallium arsenide is known to have a relatively high resistivity and low capacitance as compared to silicon which has high capacitance and low resistivity. Therefore, increased leakage problems occur in silicon devices that are generally not encountered in devices employing gallium arsenide. It is also well known in the semiconductor art that monolithic devices have desirable characteristics and properties as opposed to hybrid devices. Monolithic devices have reduced parasitics as well as no bond wires. The absence of bond wires in monolithic devices allows for increased yields in fabrication.

Monolithic microwave integrated circuits are generally fabricated using horizontal technology. In this technology, semiconductor device structures are built adjacent to each other and interconnected. Although reliable integrated circuits may be fabricated using horizontal processes, increased amounts of chip surface area are required. The requirement of increased chip surface area, in turn, causes the monolithic microwave integrated circuits to be fairly substantial in size. Therefore, a vertical technology wherein semiconductor components are stacked would require less chip surface area and allow for monolithic microwave integrated circuits of a reduced size.

SUMMARY OF THE INVENTION

Accordingly, it is an object of the present invention to provide a monolithic microwave integrated circuit wherein semiconductor components are stacked using a vertical technology.

Another object of the present invention is to provide a monolithic microwave integrated circuit requiring less chip surface area, thereby allowing for integrated circuits of reduced size.

It is an additional object of the present invention to provide a monolithic microwave integrated circuit which may be fabricated at a reduced cost.

Yet a further object of the present invention is to provide a monolithic microwave integrated circuit wherein larger component values may be obtained in a reduced space.

The foregoing and other objects and advantages are achieved in the present invention by one embodiment in which, as a part thereof, includes a semi-insulating substrate, a first metal layer disposed thereon, a first layer of non-conducting material disposed on the first metal layer and at least two additional metal layers disposed on the first layer of non-conducting material wherein the additional metal layers are isolated from each other by additional layers of non-conducting material disposed therebetween. This base structure may be employed to form passive devices such as stacked capacitors, either in series or parallel, a stacked capacitor and inductor combination, and a stacked inductor combination whereby a transformer may be formed. Additionally, the stacked structure may be formed on a FET or a diode. This invention allows the fabrication of numerous combinations of stacked integrated circuit components.

A more complete understanding of the present invention can be attained by considering the following detailed description in conjunction with the accompanying drawings.

BRIEF DESCRIPTION OF THE DRAWINGS

FIG. 1a illustrates a highly enlarged cross-sectional view of a portion of vertically stacked capacitors embodying the present invention;

FIG. 1b illustrates a schematic diagram of the vertically stacked capacitors of FIG. 1a;

FIG. 2a illustrates a highly enlarged cross-sectional view of a portion of a vertically stacked capacitor and inductor embodying the present invention;

FIG. 2b illustrates a schematic diagram of the vertically stacked capacitor and inductor of FIG. 2a;

FIG. 3a illustrates a highly enlarged cross-sectional view of a portion of vertically stacked inductors embodying the present invention;

FIG. 3b illustrates a schematic diagram of the vertically stacked inductors of FIG. 3a.

DETAILED DESCRIPTION OF THE INVENTION

Figure 4:
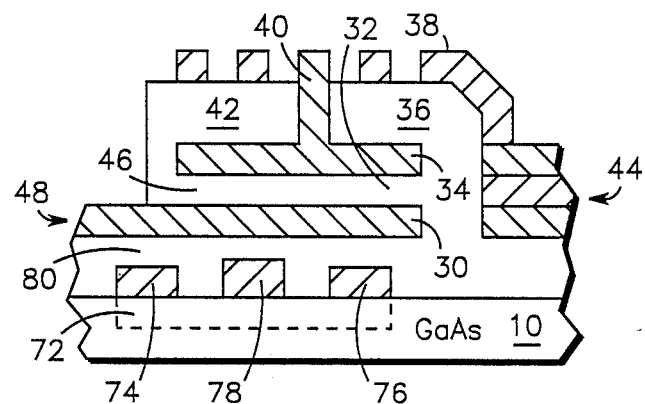
FIG. 4 illustrates a highly enlarged cross-sectional view of a portion of a vertically stacked capacitor and inductor disposed on a FET.

FIG. 1a illustrates a highly enlarged cross-sectional view of vertically stacked capacitors embodying the present invention. FIG. 1b is a schematic diagram of the vertically stacked capacitors of FIG. 1a. The vertically stacked capacitors include a substrate 10 which is a semi-insulating or dielectric substrate. Substrate 10 must be semi-insulating or dielectric so that a low capacitance is maintained between substrate 10 and subsequent metal layers. In this embodiment, substrate 10 is comprised of gallium arsenide which must remain undoped to be semi-insulating. If gallium arsenide substrate 10 were doped, diodes would be formed. This is undesirable in the present invention. Undoped gallium arsenide is desirable because of its properties of high resistance and low capacitance which enable its use in high frequency devices. Although gallium arsenide is used in this embodiment, one skilled in the art will understand that substrate 10 may be comprised of various semi-insulating or dielectric materials such as other group III-V compounds or alumina (i.e. $Al_2O_3$).

A first metal layer 12 is disposed on substrate 10. In this embodiment, first metal layer 12 is comprised of three layers. First, a layer of titanium is formed on substrate 10. The titanium layer serves as a Schottky contact in this embodiment. Following the formation of the titanium layer, a layer of platinum is formed thereon. The platinum layer serves as a barrier layer. Finally, a layer of gold is formed on the platinum layer. The gold layer should not be deposited directly on gallium arsenide substrate 10 because it will diffuse into substrate 10 and loose its Schottky characteristics. Although this embodiment uses a three layer scheme to form first metal layer 12, one skilled in the art will understand that many other metal schemes may be used. Another metal scheme commonly used comprises a layer of titanium disposed on substrate 10 and a layer of gold disposed on the titanium layer without a platinum layer therebetween. It should be further understood that layers of superconducting material may be employed.

Following the formation, patterning and etching of first metal layer 12, a first layer of non-conducting material 14 is formed thereon. First layer of non-conducting material 14 may be comprised of one of many dielectric materials such as oxides, nitrides or polyimide. Additionally, various combinations of dielectric materials may be used to form first layer of non-conducting material 14. In this embodiment, first layer of non-conducting material 14 comprises a layer of polyimide formed on first metal·layer 12 and a nitride layer which is formed on the polyimide layer.

Following the formation of first layer of non-conducting material 14, at least two additional metal layers must be formed thereon. The additional metal layers are isolated from each other by additional layers of non-conducting material disposed therebetween. In this embodiment, a second metal layer 16 is formed on first layer of non-conducting material 14. Second metal layer 16 is also comprised of the various metal schemes employed in forming first metal layer 12. Once second metal layer 16 has been formed, patterned and etched, a second layer of non-conducting material 18 is formed thereon. The second layer of non-conducting material 18 may be comprised of one of many dielectric materials or combinations of dielectric materials as is first layer of non-conducting material 14.

Following the formation of second layer of non-conducting material 18, a third metal layer 20 is formed thereon. Third metal layer 20 is formed of the same material and in the same manner as second metal layer 16. The resultant device comprises two vertically stacked capacitors. A first capacitor 22 is disposed beneath a second capacitor 24. A first lead 26 and a second lead 28 extend from the various metal layers and enable operation of the device. One skilled in the art will understand that first capacitor 22 and second capacitor 24 may be connected either in series of in parallel.

FIG. 2a is a highly enlarged cross-sectional view of a vertically stacked capacitor and inductor. FIG. 2b is a schematic diagram of the vertically stacked capacitor and inductor of FIG. 2a. The device structure of FIG. 2a is very similar to that of FIG. 1a and fabrication occurs in essentially the same manner. Again, a semi-insulating substrate 10 is provided and a first metal layer 30 is formed, patterned and etched thereon. Next, a first layer of non-conducting material 32 is formed on first metal layer 30. A second metal layer 34 is formed, patterned and etched on first layer of non-conducting material 32. This is followed by the formation of a second layer of non-conducting material 36. A third metal layer 38 is then formed, patterned and etched on second layer of non-conducting material 36. Second metal layer 34 and third metal layer 48 are coupled by metal coupling layer 40. Since third metal layer 38 is patterned and etched to form a coil, its connection with second metal layer 34 through metal coupling layer 40 creates an inductor 42. Inductor 42 is connected to inductor lead 44. The combination of first metal layer 30 and second metal layer 34 as shown create a capacitor 46. Capacitor 46 is coupled to capacitor lead 48.

FIG. 3a is a highly enlarged cross-sectional view of a third embodiment of the present invention comprising vertically stacked inductors. FIG. 3b is a schematic diagram of the vertically stacked inductors of FIG. 3a. One skilled in the art will understand that the vertically stacked inductors comprise a transformer 50. The device structure of FIG. 3a is similar to that of FIGS. 1a and 2a and is fabricated in essentially the same manner. Transformer 50 of FIG. 3a includes a semi-insulating substrate 10 which is comprised of undoped gallium arsenide in this embodiment. A first metal layer 52 is formed, patterned and etched to form a coil on substrate 10. A first layer of non-conducting material 54 is formed on first metal layer 52 and in between the turns of the coil. A second metal layer 56 is formed on first layer of non-conducting material 54. Second metal layer 56 is then patterned and etched. A second layer of non-conducting material 58 is then formed on second metal layer 56 followed by a third metal layer 60 formed on second layer of non-conducting material 58. Third metal layer 60 is then patterned and etched to form a coil as was first metal layer 52. First metal layer 52 and third metal layer 60 are coupled to each other by metal coupling layer 62 This allows for the formation of a first inductor 64 and second inductor 66. First inductor 64 is coupled to a first inductor lead 68 while second inductor 66 is coupled to a second inductor lead 70.

The present invention may also be used and processed in combination with active electrical devices. FIG. 4 illustrates a highly enlarged cross-sectional view of a portion of a vertically stacked capacitor and inductor disposed on a FET. Although a FET is shown in this embodiment, it should be understood that other devices such as diodes may also be employed beneath the vertically stacked structure.

FIG. 4 includes semi-insulating substrate 10 which is comprised of gallium arsenide in this embodiment. Substrate 10 includes a doped channel 72 on which the FET is fabricated. It should be understood that this FET is formed on substrate 10 by methods well known in the art. A source ohmic contact 74, a drain ohmic contact 76 and a gate 78 are disposed on channel 72. Following the formation of the FET, a non-conducting layer 80 is formed on the FET. This is followed by the formation of the stacked devices of the the present invention on non-conducting layer 80. In this embodiment, non-conducting layer 80 comprises essentially the same materials as the other layers of non-conducting material. In this figure, the stacked capacitor and inductor disposed on the FET are similar to those shown in FIG. 2a and are fabricated in essentially the same way.

In the present invention, additional coupling between turns in the coil of the various inductors may be enhanced by disposing magnetic materials such as ferrite compounds in between the turns of the various coils. The magnetic materials are used in place of the non-conducting material layers discussed earlier.

One skilled in the art will understand that the present invention may be used to create device structures having additional vertically stacked metal layers isolated from each other by additional layers of non-conducting material. This will enable structures having numerous vertically stacked devices. One skilled in the art will also understand that many configurations other than those shown in the above embodiments may be fabricated using the present invention.

Thus it is apparent that there has been provided, in accordance with the invention, an improved monolithic microwave integrated circuit having multiple, vertically stacked components which meets the objects and advantages set forth above. While specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

We claim:

1. A III-V compound monolithic microwave integrated circuit having multiple, vertically stacked components comprising:
   a semi-insulating substrate;
   a first metal layer disposed on said semi-insulating substrate;
   a first layer of non-conducting material disposed on said first metal layer; and
   at least two additional metal layers disposed on said first layer of non-conducting material, said additional metal layers being isolated from each other by additional layers of non-conducting material disposed therebetween, said metal layers and said layers of non-conducting material forming passive devices.

2. The monolithic microwave integrated circuit of claim 1 wherein the passive devices are of the group consisting of capacitors, inductors and transfomers.

3. The monolithic microwave integrated circuit of claim 1 wherein the semi-insulating substrate comprises gallium arsenide.

4. The monolithic microwave integrated circuit of claim 1 wherein the semi-insulating substitute comprises an alumina compound.

5. The monolithic microwave integrated circuit of claim 1 wherein the first metal layer comprises titanium and gold.

6. The monolithic microwave integrated circuit of claim 5 wherein the first metal layer further comprises platinum.

7. The monolithic microwave integrated circuit of claim 1 wherein the metal layers are comprised of superconducting materials.

8. The monolithic microwave integrated circuit of claim 1 wherein the non-conducting layers comprise oxide, nitride, polyimide or combinations thereof.

9. The monolithic microwave integrated circuit of claim 1 wherein the non-conducting layers comprise magnetic materials.

10. The monolithic microwave integrated circuit of claim 1 wherein the vertically stacked passive devices are disposed on active electrical devices including FETs and diodes.

11. A monolithic microwave integrated circuit having multiple, vertically stacked components comprising:
    a semi-insulating gallium arsenide substrate;
    a first metal layer comprising titanium and gold, said first metal layer disposed on said semi-insulating substrate;
    a first layer of non-conducting material disposed on said first metal layer; and
    at least two additional metal layers disposed on said first layer of non-conducting material, said additional metal layers being isolated from each other by additional layers of non-conducting material disposed therebetween, said metal layers and said layers of non-conducting material forming passive devices.

12. The monolithic microwave integrated circuit of claim 11 wherein the passive devices are of the group consisting of capacitors, inductors and transformers.

13. The monolithic microwave integrated circuit of claim 11 wherein the first metal layer further comprises platinum.

14. The monolithic microwave integrated circuit of claim 11 wherein the non-conducting layers comprise oxide, nitride, polyimide or combinations thereof.

15. The monolithic microwave integrated circuit of claim 11 wherein the non-conducting layers comprise magnetic materials.

16. The monolithic microwave integrated circuit of claim 11 wherein the vertically stacked passive devices are disposed on active electrical devices including FETs and diodes.

17. A method of fabricating III-V compound monolithic microwave integrated circuit having multiple, vertically stacked components comprising the steps of:
    providing a semi-insulating substrate;
    forming a first metal layer on said semi-insulating substrate;
    forming a first layer of non-conducting material on said first metal layer;
    forming at least two additional metal layers on said first layer of non-conducting material, said additional metal layers to be isolated from each other by the formation of additional non-conducting layers therebetween, said metal layers and said layers of nonconducting material forming passive devices.

18. The method of claim 17 wherein the passive devices are of the group consisting of capacitors, inductors and transformers.

19. The method of claim 17 Wherein the steps of providing a semi-insulating substrate includes providing a gallium arsenide substrate.

20. The method of claim 19 wherein the step of forming a first metal layer further comprises the steps of:
    forming a layer of titanium on the semi-insulating, gallium arsenide substrate; and
    forming a layer of gold on said layer of titanium.

21. The method of claim 20 wherein the step of forming a first metal layer further comprises the step of forming a platinum layer between the layer of titanium and the layer of gold.

22. The method of claim 17 wherein the steps of forming the metal layers of superconducting materials.

23. The method of claim 17 wherein the steps of forming a first layer of non-conducting material and additional layers of non-conducting material include forming said layers of oxide, nitride, polyimide or combinations thereof.

24. The method of claim 23 wherein the steps of forming a first layer of non-conducting material and additional layers of non-conducting material include forming a layer of polyimide and then forming an oxide or nitride layer thereon.

25. The method of claim 17 wherein the steps of forming a first layer of non-conducting material and additional layers of non-conducting material include forming said layers of magnetic materials.

26. The method of claim 17 wherein the monolithic microwave integrated circuit is formed on active electrical devices including FETs and diodes.

* * * * *